(12) United States Patent
Jeong

(10) Patent No.: US 7,238,614 B2
(45) Date of Patent: Jul. 3, 2007

(54) METHODS FOR FABRICATING ONE OR MORE METAL DAMASCENE STRUCTURES IN A SEMICONDUCTOR WAFER

(75) Inventor: In Kwon Jeong, Cupertino, CA (US)

(73) Assignee: Inopla Inc., San Jose, CA (US)

( * ) Notice: Subject to any disclaimer, the term of this patent is extended or adjusted under 35 U.S.C. 154(b) by 0 days.

(21) Appl. No.: 11/270,270

(22) Filed: Nov. 8, 2005

(65) Prior Publication Data

US 2006/0099807 A1 May 11, 2006

Related U.S. Application Data

(60) Provisional application No. 60/627,029, filed on Nov. 10, 2004.

(51) Int. Cl.
*H01L 23/495* (2006.01)

(52) U.S. Cl. .................... 438/672; 438/637; 257/751

(58) Field of Classification Search ............... 438/637, 438/638, 672, 691; 257/751, 775
See application file for complete search history.

(56) References Cited

U.S. PATENT DOCUMENTS 6,656,842 B2 * 12/2003 Li et al. .................... 438/691

* cited by examiner

*Primary Examiner*—Phuc T. Dang
(74) *Attorney, Agent, or Firm*—Thomas H. Ham; Wilson & Ham

(57) ABSTRACT

Methods for fabricating one or more metal (e.g., copper) damascene structures in a semiconductor wafer use at least three polishing steps to reduce erosion topography in the resulting metal damascene structures and/or increase throughput. The polishing steps may be performed at four polishing units of a polishing apparatus, which may include one or more pivotable load/unload cups to transfer the semiconductor wafer between some of the polishing units.

9 Claims, 9 Drawing Sheets

METHODS FOR FABRICATING ONE OR MORE METAL DAMASCENE STRUCTURES IN A SEMICONDUCTOR WAFER

CROSS REFERENCE TO RELATED APPLICATION

This application is entitled to the benefit of U.S. Provisional Patent Application Ser. No. 60/627,029, filed on Nov. 10, 2004, which is incorporated herein by reference.

FIELD OF THE INVENTION

The invention relates generally to semiconductor processing methods, and more particularly to a method for fabricating copper damascene structures.

BACKGROUND OF THE INVENTION

Local and global planarization of semiconductor wafers becomes increasingly important as more metal layers and interlayer dielectric layers are stacked on the wafers. A preferred method to planarize semiconductor wafers is the chemical mechanical polishing (CMP) method, where a surface of a semiconductor wafer is polished using a slurry solution supplied between the wafer and a polishing pad. The CMP method is also widely used for damascene process to form copper (Cu) interconnect structures on the semiconductor wafers.

As illustrated in FIG. 1A, in order to form a Cu damascene structure using a conventional CMP method, a semiconductor wafer 10 having a dielectric layer 12 with trenches, a barrier metal layer 14 and a Cu layer 16 is fabricated. The Cu layer 16 is then polished using a first continuous CMP process at a first polishing unit of a polishing apparatus until the barrier layer 14 on the upper surface of the dielectric layer 12 is exposed to remove the Cu layer above the barrier layer. Next, the barrier layer 14 on the upper surface of the dielectric layer 12 is polished at a second polishing unit of the polishing apparatus using a second CMP process to remove the barrier layer on the upper surface of the dielectric layer, which results in the semiconductor wafer 20 with the Cu damascene structure, as illustrated in FIG. 1B.

In an another conventional CMP method, the Cu layer 16 is polished using first and second serial CMP processes at first and second polishing units of a polishing apparatus, respectively, to remove the Cu layer above the barrier layer 14 until the barrier layer on the upper surface of the dielectric layer 12 is exposed. Next, the barrier layer 14 on the upper surface of the dielectric layer 12 is polished at a third polishing unit of the polishing apparatus using a third CMP process to remove the barrier layer on the upper surface of the dielectric layer, which results in the semiconductor wafer 20 with the Cu damascene structure, as illustrated in FIG. 1B.

A concern with the conventional CMP methods for forming a Cu damascene structure is that the resulting Cu damascene structure will typically have a non-planar erosion topography 22, as illustrated in FIG. 1B, which can significantly degrade the final semiconductor device. This erosion topography 22 is formed during the process of removing the Cu layer 16, the barrier metal layer 14 or both of the layers.

Another concern with the conventional CMP methods is that the throughput of the polishing apparatus with two or three polishing units drops drastically for Cu damascene structures that require removing a thicker portion of the Cu layer over the barrier metal layer. It is noted that the thicker the Cu layer to be removed is, the polishing times of the respective polishing units become more unbalanced, and therefore, the last polishing unit of the polishing apparatus to remove the barrier metal layer idles while the other polishing units polish the Cu layers.

In view of these concerns, there is a need for methods for fabricating one or more Cu damascene structures in a semiconductor wafer that reduce erosion topography of the Cu damascene structures and/or increase throughput.

SUMMARY OF THE INVENTION

Methods for fabricating one or more metal (e.g., copper) damascene structures in a semiconductor wafer use at least three polishing steps to reduce erosion topography in the resulting metal damascene structures and/or increase throughput. The polishing steps may be performed at four polishing units of a polishing apparatus, which may include one or more pivotable load/unload cups to transfer the semiconductor wafer between some of the polishing units.

A method for fabricating a metal damascene structure in a semiconductor wafer in accordance with a first embodiment of the invention comprises providing the semiconductor wafer that includes a dielectric layer with trenches below an upper surface, a barrier layer over the dielectric layer and a metal layer over the barrier layer, removing an upper portion of the metal layer using a first polishing technique such that a lower portion of the metal layer remains over the barrier layer on the upper surface of the dielectric layer, removing the lower portion of the metal layer using a second polishing technique until the barrier layer on the upper surface of the dielectric layer is exposed, removing the barrier layer on the upper surface of the dielectric layer using a third polishing technique until the upper layer of the dielectric layer is exposed to produce the metal damascene structure with erosion topography, and planarizing the metal damascene structure with the erosion topography using a fourth polishing technique to reduce the erosion topography of the metal damascene structure.

A method for fabricating a metal damascene structure in a semiconductor wafer in accordance with a second embodiment of the invention comprises providing the semiconductor wafer that includes a dielectric layer with trenches below an upper surface, a barrier layer over the dielectric layer and a metal layer over the barrier layer, removing an upper portion of the metal layer using a first polishing technique such that an intermediate portion and a lower portion of the metal layer remain over the barrier layer, removing the intermediate portion of the metal layer using a second polishing technique such that the lower portion of the metal layer remains over the barrier layer, removing the lower portion of the metal layer using a third polishing technique until the barrier layer on the upper surface of the dielectric layer is exposed, and removing the barrier layer on the upper surface of the dielectric using a fourth polishing technique until the upper surface of the dielectric layer is exposed to produce the metal damascene structure.

A method for fabricating metal damascene structures in a semiconductor wafer in accordance with an embodiment of the invention comprises forming a first metal damascene structure in the semiconductor wafer and forming a second metal damascene structure in the semiconductor wafer. The first metal damascene structure in the semiconductor wafer is formed using the above method for fabricating a metal damascene structure in accordance with the first embodiment of the invention with or without the step of planarizing the metal damascene structure. The second metal damascene structure in the semiconductor wafer is formed using the above method for fabricating a metal damascene structure in accordance with the second embodiment of the invention.

A method for fabricating a metal damascene structure in a semiconductor wafer in accordance with another embodiment of the invention comprises providing the semiconductor wafer at a polishing apparatus that comprises four polishing units, the semiconductor wafer including a dielectric layer with trenches below an upper surface, a barrier layer over the dielectric layer and a metal layer over the barrier layer, removing an upper portion of the metal layer using a first polishing technique at a first polishing unit of the polishing apparatus such that a lower portion of the metal layer remains over the barrier layer on the upper surface of the dielectric layer, removing the lower portion of the metal layer using a second polishing technique at a second polishing unit of the polishing apparatus until the barrier layer on the upper surface of the dielectric layer is exposed, and removing the barrier layer on the upper surface of the electric layer using a third polishing technique at a third polishing unit of the polishing apparatus until the upper layer of the dielectric layer is exposed to produce the metal damascene structure.

Other aspects and advantages of the present invention will become apparent from the following detailed description, taken in conjunction with the accompanying drawings, illustrated by way of example of the principles of the invention.

DETAILED DESCRIPTION

Figure 1B:
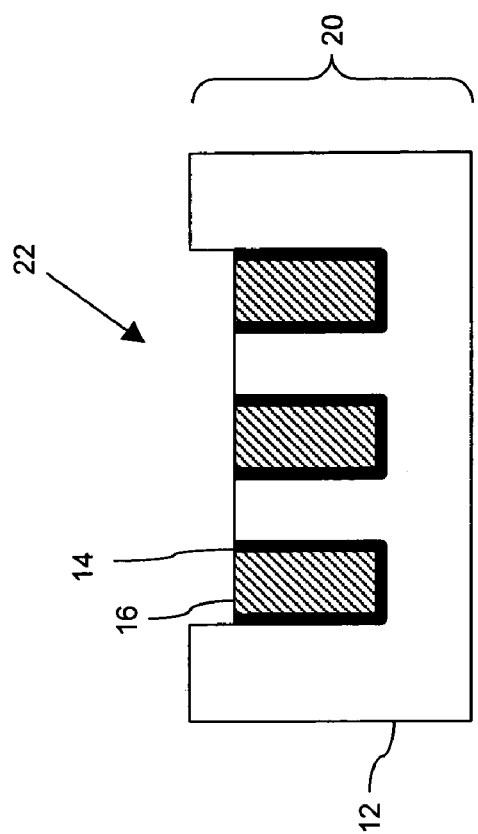
FIGS. 1A and 1B are partial cross-sectional views of a semiconductor wafer before and after a conventional chemical-mechanical polishing method in accordance with the prior art is performed to form a copper (Cu) damascene structure in the wafer.
Figure 1A:
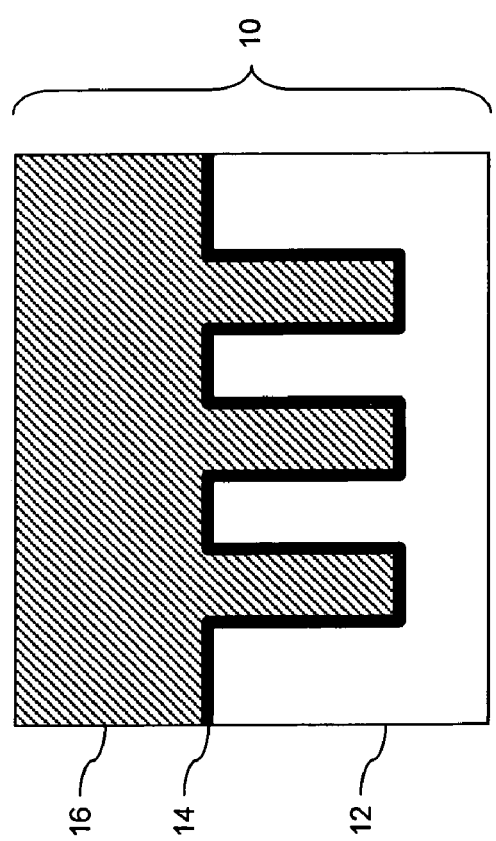
Figure 2:
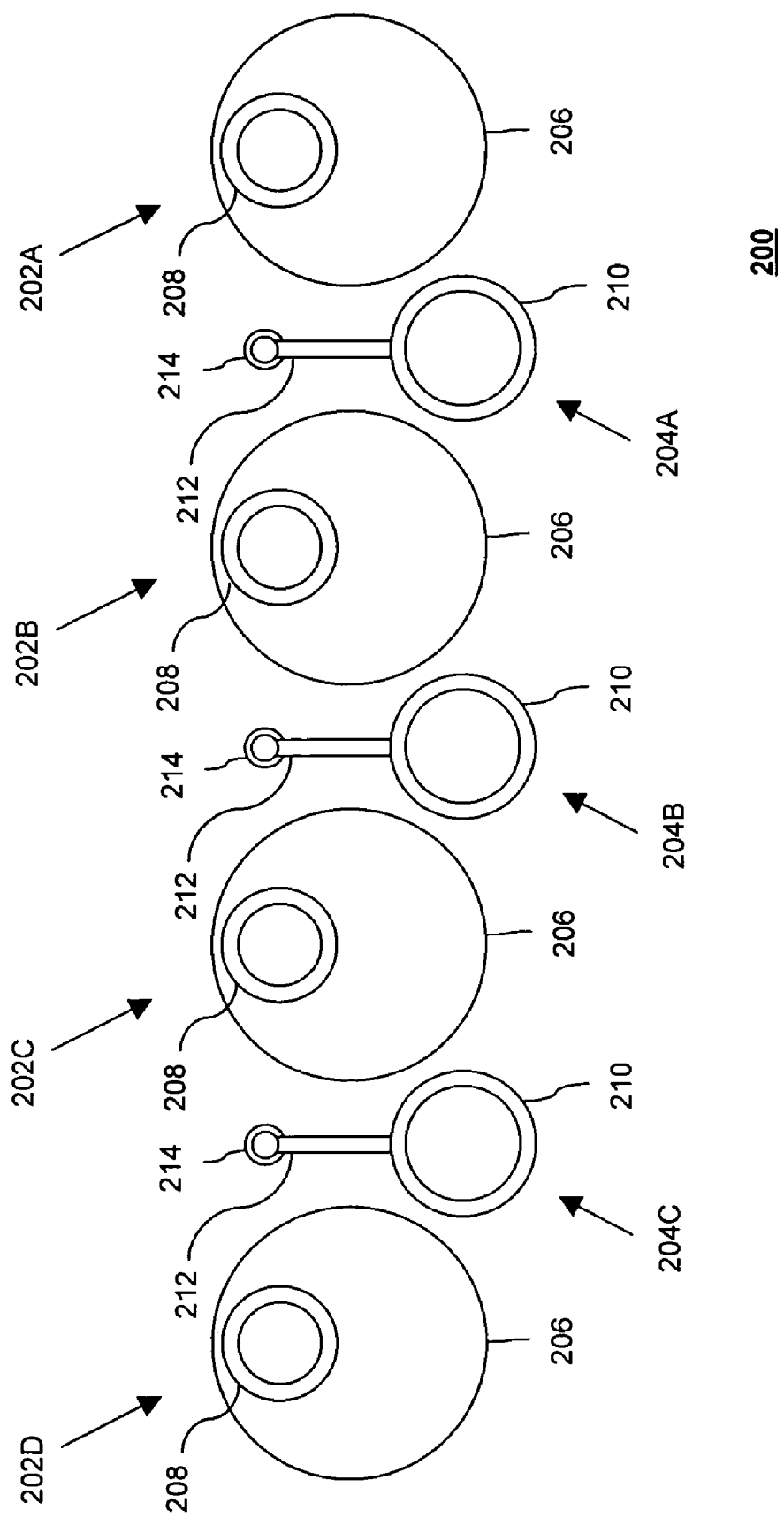
FIG. 2 is a diagram of a polishing apparatus with four polishing units and three pivotable load/unload cups that can be used to perform methods for fabricating one or more Cu damascene structures in a semiconductor wafer in accordance with the invention.

Methods for fabricating one or more copper (Cu) dainascene structures in a semiconductor wafer in accordance with the invention produce Cu damascene structures with reduced non-planar erosion topography, which significantly increases the quality of the final semiconductor products, and/or produce the Cu damascene structures with increased throughput. These methods for fabricating one or more Cu damascene structures are described herein as being performed using a polishing apparatus 200 with four polishing units 202A, 202B, 202C and 202D and three pivotable load/unload cups 204A, 204B and 204C, which is illustrated in FIG. 2. The polishing apparatus 200 is described in U.S. Patent Application Publication Ser. No. US 2004/0209550 A1, entitled "Apparatus and Method for Polishing Semiconductor Wafers using One or More Polishing Surfaces", application Ser. No. 10/829,593, filed on Apr. 21, 2004, which is incorporated herein by reference. Although the methods for fabricating one or more Cu damascene structures in accordance with the invention are described herein as using the polishing apparatus 200 of FIG. 2, any polishing apparatus with four polishing units may be used to perform these methods.

As shown in FIG. 2, the polishing apparatus 200 comprises the four polishing units 202A, 202B, 202C and 202D and the three pivotable load/unload cups 204A, 204B and 204C. Each of the polishing units 202A, 202B, 202C and 202D includes a polishing table 206 and a wafer polishing head or wafer carrier 208. The polishing table 206 has a polishing surface on which a semiconductor wafer can be polished. In an embodiment, a polishing pad is attached to the polishing table 206 to provide the polishing surface. The polishing table 206 is designed to be rotated or orbited about an axis. The wafer polishing head 208 is configured to hold a semiconductor wafer to polish the wafer on the respective polishing table 206. The wafer polishing head 208 is part of a wafer carrier assembly, which operates to rotate the wafer polishing head and lower and raise the wafer polishing head onto the polishing surface of the respective polishing table 206.

Each of the pivotable load/unload cups 204A, 204B and 204C includes a load/unload cup 210 and a shaft 212. The load/unload cup 210 is configured to receive a semiconductor wafer from one of the wafer polishing heads 208 of the polishing units 202A, 202B and 202C and to transfer the wafer to another wafer polishing head of the polishing units 202B, 202C and 202D. The load/unload cup 210 may be further configured to clean the wafer using, for example, deionized water, while transferring the wafer. The shaft 212 is attached to the load/unload cup 210. The shaft 212 is also connected to a motor 214 that can pivot the load/unload cup 210 about a pivoting axis via the shaft 212. The length of the shaft 212 and the location of the pivoting axis are selected so that the load/unload cup 210 can reach the wafer polishing heads 208 of adjacent polishing units 202A, 202B, 202C and 202D.

In operation, the pivotable load/unload cup 204A is used to receive a semiconductor wafer from the wafer polishing head 208 of the polishing unit 202A and transfer the wafer to the wafer polishing head 208 of the polishing unit 202B. Similarly, the pivotable load/unload cup 204B is used to receive the wafer from the wafer polishing head 208 of the polishing unit 202B and transfer the wafer to the wafer polishing head 208 of the polishing unit 202C. The pivotable load/unload cup 204C is similarly used to receive the wafer from the wafer polishing head 208 of the polishing unit 202C and transfer the wafer to the wafer polishing head 208 of the polishing unit 202D.

Figure 3:
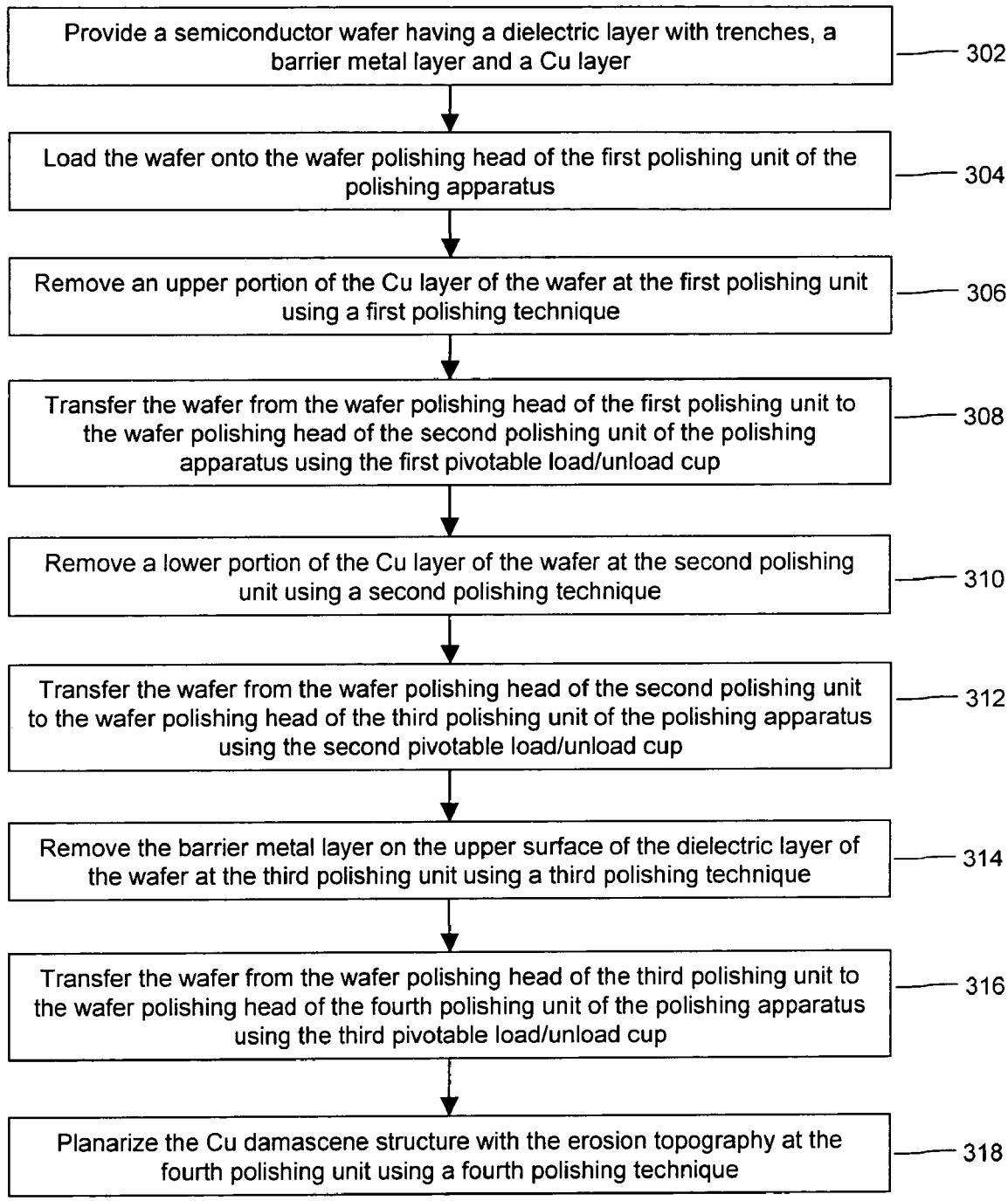
FIG. 3 is a flow diagram of a method for fabricating a Cu damascene structure in a semiconductor device in accordance with a first embodiment of the invention.
Figure 4A:
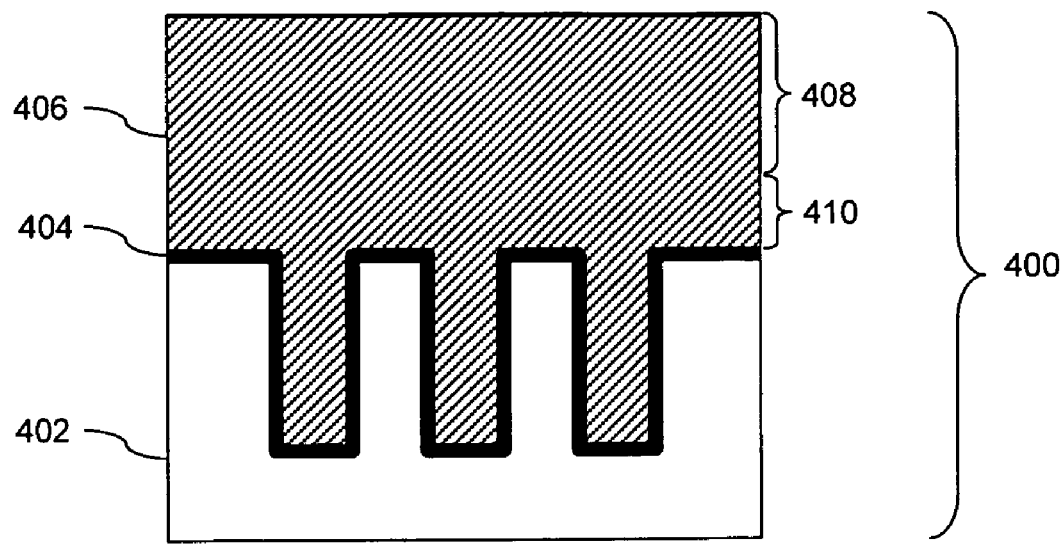
FIGS. 4A–4E are partial cross-sectional views of a semiconductor wafer at different stages during the fabrication method in accordance with the first embodiment of the invention.

A method for fabricating a Cu damascene structure in a semiconductor wafer using the polishing apparatus 200 in accordance with a first embodiment of the invention is described with reference to a flow diagram of FIG. 3 along with FIGS. 4A–4E, which are partial cross-sectional views of a semiconductor wafer 400 at different stages during the fabrication method. At block 302, the semiconductor wafer 400 having a dielectric layer 402 with trenches, a barrier metal layer 404 over the dielectric layer and a Cu layer 406 over the barrier metal layer is provided, as illustrated in FIG. 4A. As shown in FIG. 4A, the trenches in the dielectric layer 402 is located below the upper surface of the dielectric layer. As an example, the dielectric layer 402 may be an oxide layer. The barrier metal layer 404 is conformal to the upper surface of the dielectric layer 402, as well as the sides of the trenches in the dielectric layer. As an example, the barrier metal layer 404 may be a layer of tantalum (Ta) or tantalum nitride (TaN). The semiconductor wafer 400 can be formed using conventional patterning and deposition processes.

Figure 4B:
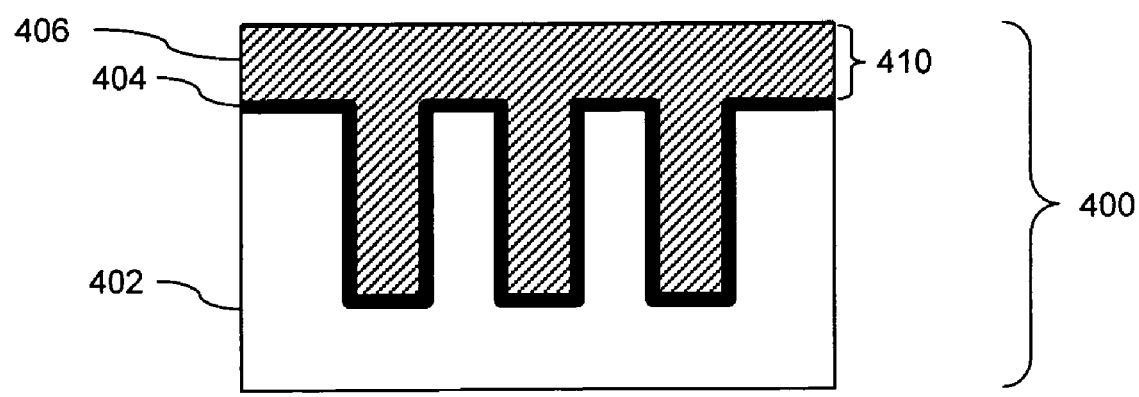

Next, at block 304, the wafer 400 is loaded onto the wafer polishing head 208 of the first polishing unit 202A of the polishing apparatus 200. As an example, the wafer 400 may be loaded onto the wafer polishing head 208 of the first polishing unit 202A by a wafer transfer robot. Next, at block 306, an upper portion 408 of the Cu layer 406 of the wafer 400 is removed at the first polishing unit 202A using a first polishing technique such that a substantial lower portion 410 of the Cu layer remains over the barrier metal layer 404 on the upper surface of the dielectric layer 402, as illustrated in FIG. 4B. The first polishing technique involves performing a chemical-mechanical polishing (CMP) process using the first polishing head 208 and the first polishing table 206 of the first polishing unit 202A and a first slurry. Both the upper and lower portions 408 and 410 of the Cu layer 406, which are above the barrier metal layer 404 on the upper surface of the dielectric layer 402, are shown in FIG. 4A. In an embodiment, the upper portion 408 of the Cu layer 406 is thicker than the lower portion 410 of the Cu layer.

Figure 4C:
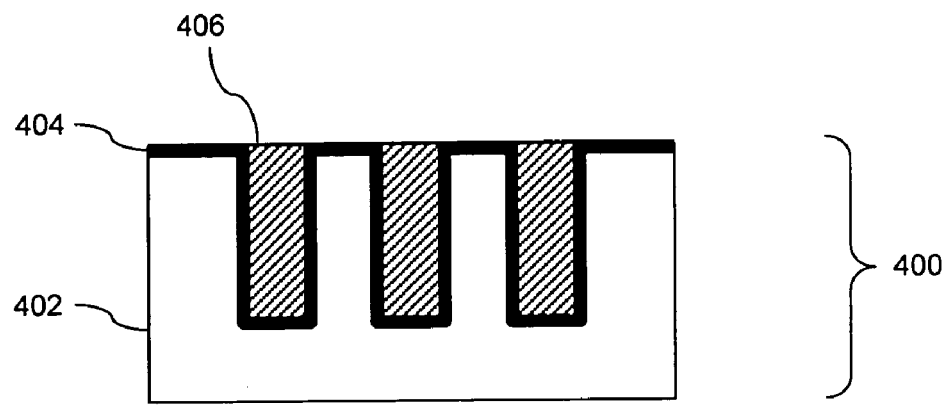

Next, at block 308, the wafer 400 is transferred from the wafer polishing head 208 of the first polishing unit 202A to the wafer polishing head 208 of the second polishing unit 202B of the polishing apparatus 200 using the first pivotable load/unload cup 204A. Next, at block 310, the lower portion 410 of the Cu layer 406 of the wafer 400 is removed at the second polishing unit 202B using a second polishing technique until the barrier metal layer 404 on the upper surface of the dielectric layer 402 is exposed, as illustrated in FIG. 4C. The second polishing technique involves performing a CMP process using the second polishing head 208 and the second polishing table 206 of the second polishing unit 202B and a second slurry. In an embodiment, the second polishing technique has a lower removal rate than the removal rate of the first polishing technique.

Figure 4D:
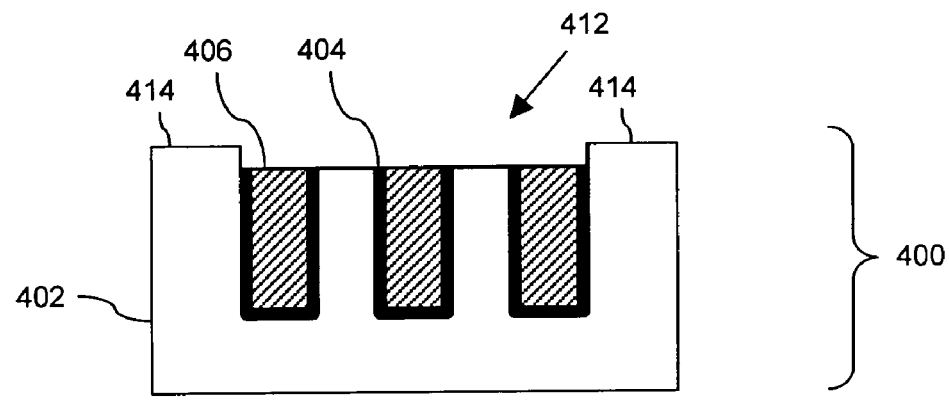

Next, at block 312, the wafer is transferred from the wafer polishing head 208 of the second polishing unit 202B to the wafer polishing head 208 of the third polishing unit 202C of the polishing apparatus 200 using the second pivotable load/unload cup 204B. Next, at block 314, the barrier metal layer 404 on the upper surface of the dielectric layer 402 of the wafer 400 is removed at the third polishing unit 202C using a third polishing technique until the upper surface of the dielectric layer is exposed, as illustrated in FIG. 4D. The third polishing technique involves performing a CMP process using the third polishing head 208 and the third polishing table 206 of the third polishing unit 202C and a third slurry. As shown in FIG. 4D, the resulting wafer 400 includes a Cu damascene structure with erosion topography 412, which produces dielectric protrusions 414.

Figure 4E:
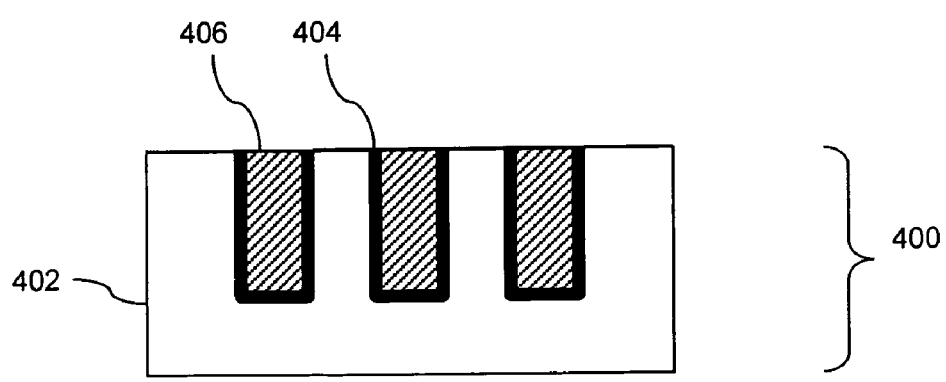

Next, at block 316, the wafer 400 is transferred from the wafer polishing head 208 of the third polishing unit 202C to the wafer polishing head 208 of the fourth polishing unit 202D of the polishing apparatus 200 using the third pivotable load/unload cup 204C. Next, at block 318, the Cu damascene structure with the erosion topography 412 is planarized at the fourth polishing unit 202D using a fourth polishing technique to reduce the dielectric protrusions 414 to reduce the non-planar erosion topography of the Cu damascene structure in the wafer 400, as illustrated in FIG. 4E. The fourth polishing technique involves performing a CMP process using the fourth polishing head 208 and the fourth polishing table 206 of the polishing unit 202D and a fourth slurry. In an embodiment, the fourth slurry has a higher removal rate of the dielectric layer 402 than the Cu layer 406 and the barrier metal layer 404. Therefore, the dielectric protrusions 414 can be removed more quickly than the Cu layer 406 and the barrier metal layer 404 to reduce the erosion topography 412. In addition to reducing the erosion topography 412, the polishing of the wafer 400 at block 318 can also reduce defects such as scratches and particles generated during the previous polishing processes of removing the Cu layer 406 and the barrier metal layer 404.

The planarization of the Cu damascene structure at the fourth polishing unit 202D of the polishing apparatus 200 is optional. Thus, the fabrication method in accordance with the first embodiment of the invention can be completed at block 314, where the barrier metal layer 404 on the upper surface of the dielectric layer 402 of the wafer 400 is removed at the third polishing unit 202C using a third polishing technique until the upper surface of the dielectric layer is exposed.

In an alternative first embodiment, the first polishing technique performed at the first polishing unit 202A involves performing an electrochemical-mechanical polishing (ECMP) process or an electrochemical polishing (ECP) process using an appropriate polishing solution. Both the ECMP and ECP processes require conducting electrical current through the semiconductor wafer being polished via the wafer polishing head and the polishing table. A difference between the two polishing processes is that the ECMP process involves a nominal mechanical polishing, e.g., in the order of 0.5 psi. In order to perform the ECMP or ECP process, the first polishing unit 202A needs to be modified so that the wafer polishing head 208 and the polishing table 206 are electrically connected to an electrical power source to conduct electric current between the wafer polishing head and the polishing table through the semiconductor wafer being polished.

Figure 5:
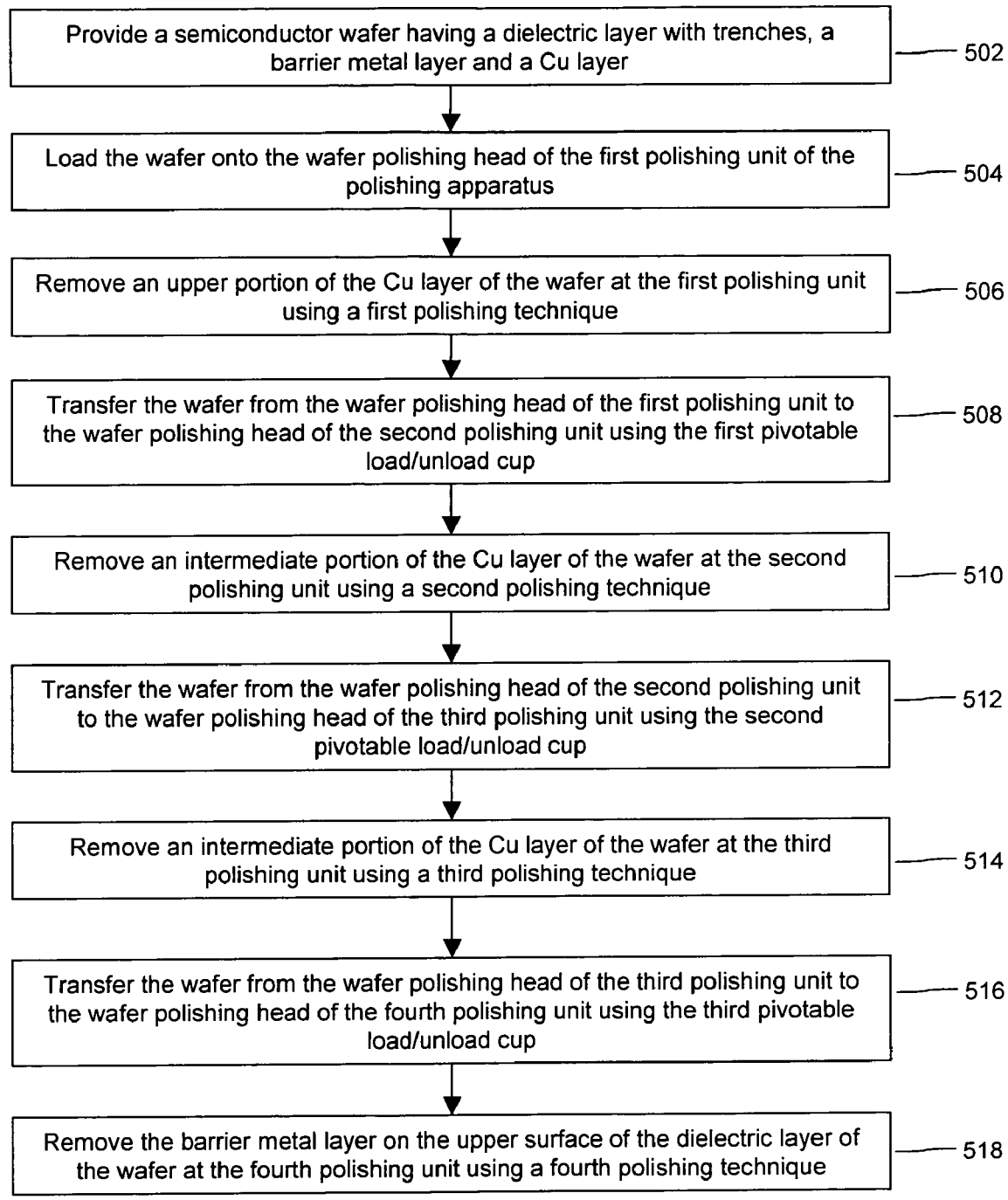
FIG. 5 is a flow diagram of a method for fabricating a Cu damascene structure in a semiconductor device in accordance with a second embodiment of the invention.
Figure 6A:
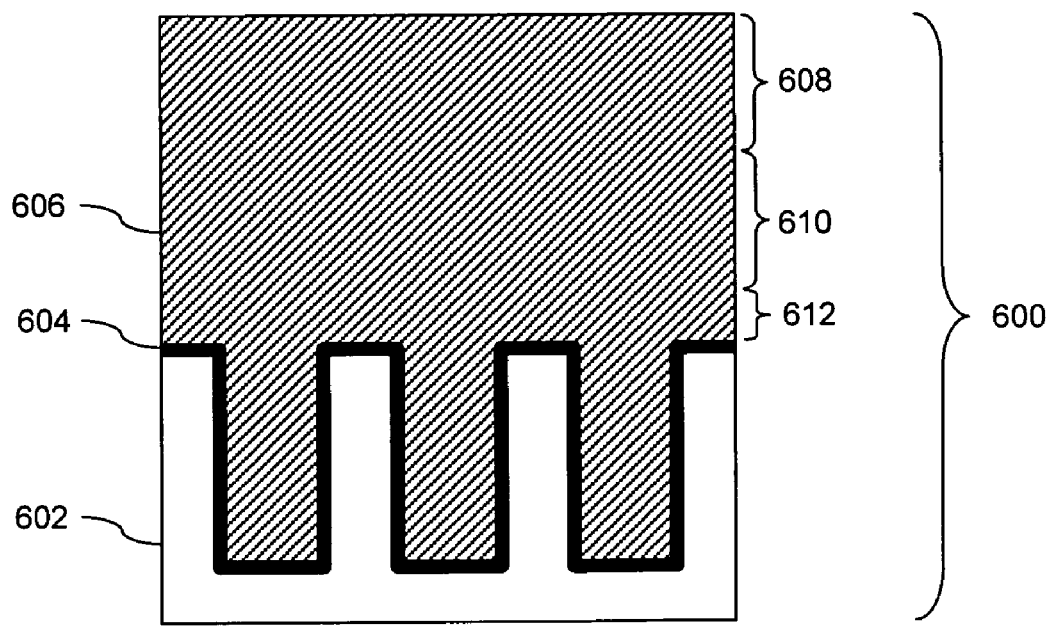
FIGS. 6A–6E are partial cross-sectional views of a semiconductor wafer at different stages during the fabrication method in accordance with the second embodiment of the invention.

A method for fabricating a Cu damascene structure in a semiconductor wafer using the polishing apparatus 200 in accordance with a second embodiment of the invention is described with reference to a flow diagram of FIG. 5 along with FIGS. 6A–6E, which are partial cross-sectional views of a semiconductor wafer 600 at different stages during the fabrication method. At block 502, the semiconductor wafer 600 having a dielectric layer 602 with trenches, a barrier metal layer 604 over the dielectric layer and a Cu layer 606 over the barrier metal layer is provided, as illustrated in FIG. 6A. The semiconductor wafer 600 of FIG. 6A is similar to the semiconductor wafer 400 of FIG. 4A. However, the trenches of the wafer 600 are deeper than the trenches of the wafer 400, and therefore, the Cu layer 606 of the wafer 600 is thicker than the Cu layer 406 of the wafer 400.

Figure 6B:
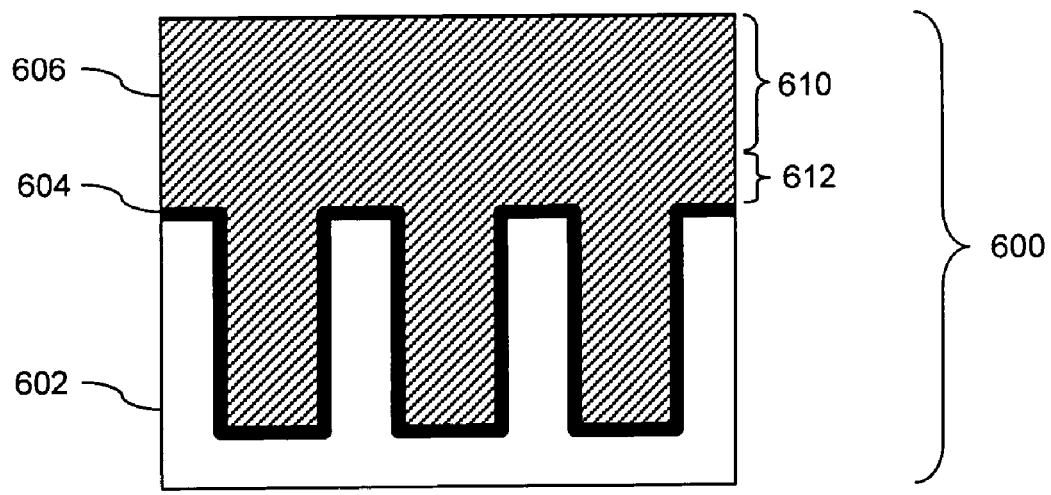

Next, at block 504, the wafer 600 is loaded onto the wafer polishing head 208 of the first polishing unit 202A of the polishing apparatus 200. Next, at block 506, an upper portion 608 of the Cu layer 606 of the wafer 600 is removed at the first polishing unit 202A using a first polishing technique such that an intermediate portion 610 and a substantial lower portion 612 of the Cu layer 606 remain over the barrier layer 604 on the upper surface of the dielectric layer 602, as illustrated in FIG. 6B. The first polishing technique involves performing a CMP process using the first polishing head 208 and the first polishing table 206 of the first polishing unit 202A and a first slurry. The upper, intermediate and lower portions 608, 610 and 612 of the Cu layer 606, which are above the barrier metal layer 604 on the upper surface of the dielectric layer 602, are shown in FIG. 6A.

Figure 6C:
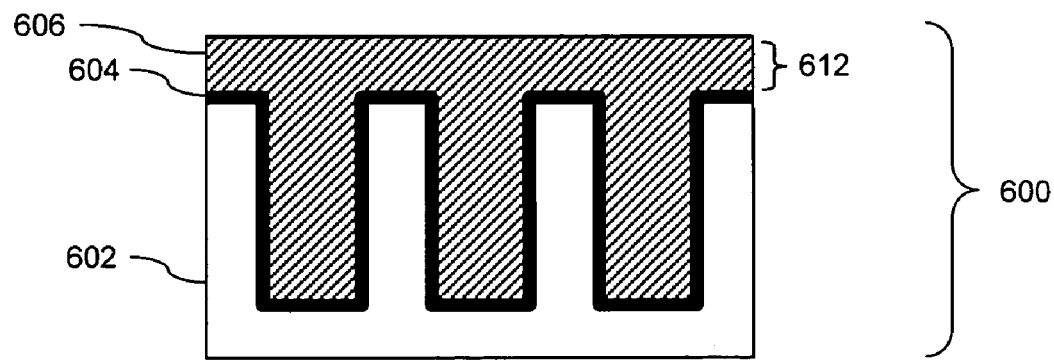

Next, at block 508, the wafer 600 is transferred from the wafer polishing head 208 of the first polishing unit 202A to the wafer polishing head 208 of the second polishing unit 202B of the polishing apparatus 200 using the first pivotable load/unload cup 204A. Next, at block 510, the intermediate portion 610 of the Cu layer 606 of the wafer 600 is removed at the second polishing unit 202B using a second polishing technique such that only the lower portion 612 of the Cu layer 606 remains over the barrier metal layer 604 on the upper surface of the dielectric layer 602, as illustrated in FIG. 6C. The second polishing technique involves performing a CMP process using the second polishing head 208 and the second polishing table 206 of the second polishing unit 202B and the same first slurry or a different kind of slurry. In an embodiment, the upper and intermediate portions 608 and 610 of the Cu layer 606 of the wafer 600 have substantially the same thickness, and the lower portion 612 of the Cu layer 606 is thinner than the upper and intermediate portions 608 and 610 of the Cu layer 606.

Figure 6D:
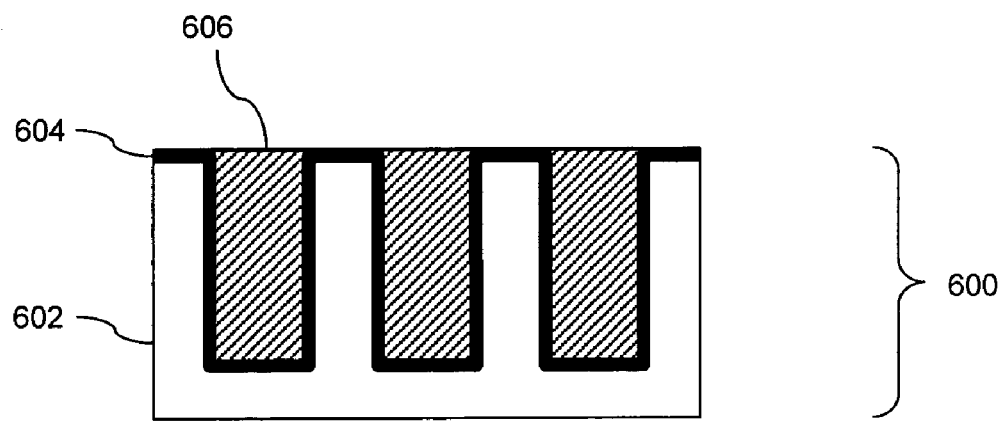

Next, at block 512, the wafer 600 is transferred from the wafer polishing head 208 of the second polishing unit 202B to the wafer polishing head 208 of the third polishing unit 202C of the polishing apparatus 200 using the second pivotable load/unload cup 204B. Next, at block 514, the lower portion 612 of the Cu layer 606 of the wafer 600 is removed at the third polishing unit 202C using a third polishing technique until the barrier metal layer 604 on the upper surface of the dielectric layer 602 is exposed, as illustrated in FIG. 6D. The third polishing technique involves performing a CMP process using the third polishing head 208 and the third polishing table 206 of the third polishing unit 202C and a second slurry. In an embodiment, the third polishing technique has a lower removal rate than the removal rates of the first and second polishing techniques.

Figure 6E:
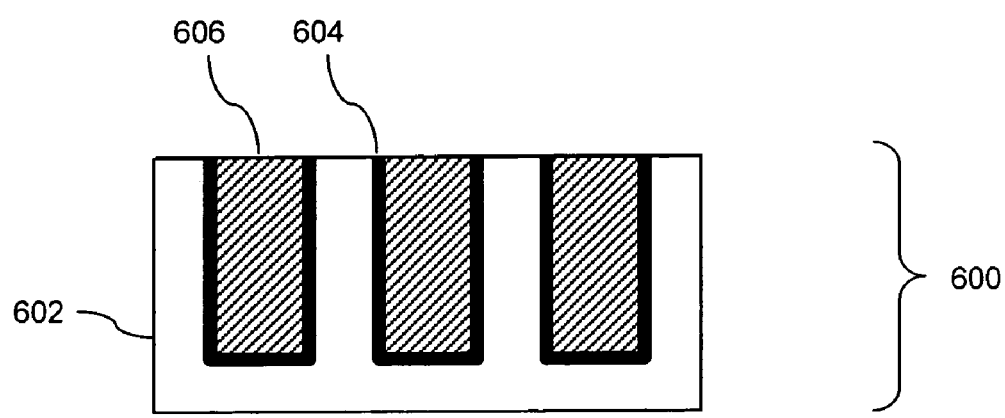

Next, at block 516, the wafer 600 is transferred from the wafer polishing head 208 of the third polishing unit 202C to the wafer polishing head 208 of the fourth polishing unit 202D of the polishing unit 200 using the third pivotable load/unload cup 204C. Next, at block 518, the barrier metal layer 604 on the upper surface of the dielectric layer 602 of the wafer 600 is removed at the fourth polishing unit 202D using a fourth polishing technique until the upper surface of the dielectric layer 602 is exposed, as illustrated in FIG. 6E. The fourth polishing technique involves performing a CMP process using the fourth polishing head 208 and the fourth polishing table 206 of the fourth polishing unit 202D and a third slurry.

In an alternative second embodiment, one or both of the first polishing technique performed at the first polishing unit 202A and the second polishing technique performed at the second polishing unit 202B involve performing an ECMP process or an ECP process using an appropriate polishing solution. If the ECMP or ECP process is to be performed at one or both of the polishing units 202A and 202B, one or both of these polishing units need to be modified so that the respective wafer polishing head 208 and the respective polishing table 206 are electrically connected to an electrical power source to conduct electric current between the wafer polishing head and the polishing table through the semiconductor wafer being polished.

Figure 7:
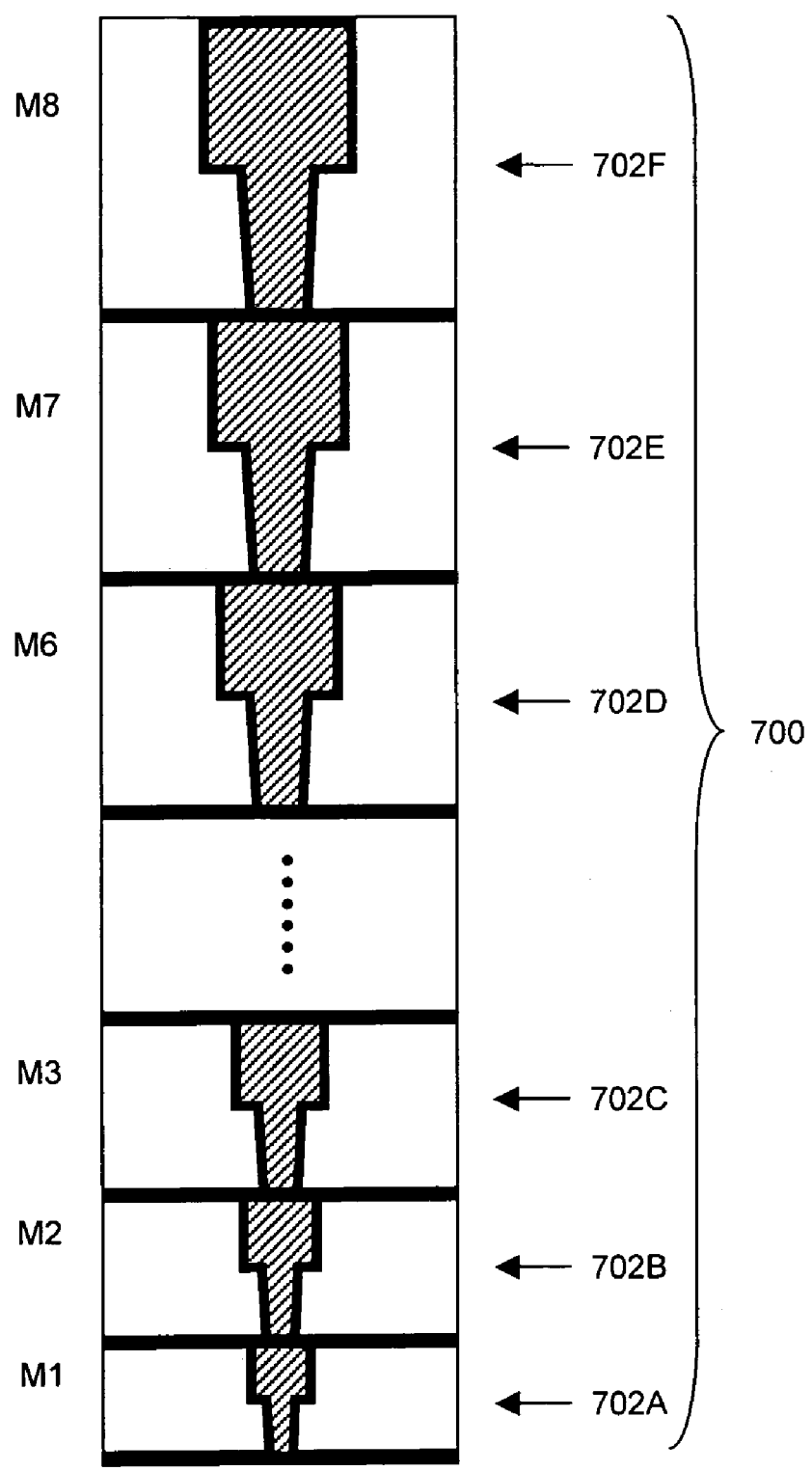
FIG. 7 is a partial cross-sectional view of a semiconductor wafer with multi-level dual Cu damascene structures, which are formed using both the fabrication method in accordance with the first or alternative first embodiment of the invention and the fabrication method in accordance with the second or alternative second embodiment of the invention.

The above-described methods for fabricating a Cu damascene structure in a semiconductor wafer in accordance with different embodiments of the invention can be combined to fabricate a semiconductor wafer 700 with multi-level dual Cu damascene structures, as illustrated in FIG. 7. As shown in FIG. 7, the wafer 700 includes dual Cu damascene structures 702A, 702B, 702C, 702D, 702E and 702F at different metal layers, M1, M2, M3 . . . M6, M7 and M8. The planar layers between adjacent metal layers are diffusion barrier layers. Although the wafer 700 in FIG. 7 is shown as having a particular number dual Cu damascene structures, the wafer may include any number of Cu damascene structures. The trench depth of the Cu damascene structures 702A, 702B, 702C, 702D, 702E and 702F of the wafer 700 increases from the lowest level metal layer, i.e., M1 layer, to the highest level metal layer, i.e., M8 layer. Thus, the trench depth of the damascene structure 702A is shallowest, e.g., 0.3 microns, while the trench depth of the damascene structure 702F at M8 layer is deepest, e.g., 1.5 microns.

The Cu damascene structures of the wafer 700 at lower levels, such as M1–M3 layers, have relatively shallow trenches, and therefore, relatively thin Cu layers are deposited to fill the trenches of the Cu damascene structures 702A, 702B and 702C during fabrication of these Cu damascene structures. In order to form theses Cu damascene structures 702A, 702B and 702C, the fabrication method in accordance with the first embodiment or the alternative first embodiment of the invention can be used, which can reduce erosion topography, and therefore, improve the planarity of the polished surfaces. Alternatively, in order to form the Cu damascene structures 702A, 702B and 702C, the fabrication method in accordance with the optional embodiment of the first embodiment of the invention can be used, which does not perform planarization CMP to reduce erosion topography.

The Cu damascene structures of the wafer 700 at higher levels, such as M6–M8 layers, have relatively deep trenches, and therefore, relatively thick Cu layers are deposited to fill the trenches of the Cu damascene structures 702D, 702E and 702F during fabrication of these Cu damascene structures. In order to form theses Cu damascene structures 702D, 702E and 702F, the fabrication method in accordance with the second embodiment or the alternative second embodiment of the invention can be used to increase throughput. Because erosion topography is relatively less important for the higher-level Cu damascene structures than for lower-level Cu damascene structures, it is more productive to use the fabrication method in accordance with the second embodiment or the alternative second embodiment of the invention to form these higher-level Cu damascene structures 702D, 702E and 702F than to use the fabrication method in accordance with the first embodiment or the alternative first embodiment of the invention.

The Cu damascene structures 702A, 702B, 702C, 702D, 702E and 702F of the wafer 700 can be fabricated on the same polishing apparatus with four polishing units, such as the polishing apparatus 200, or on different polishing apparatus with four polishing units, such as multiple polishing apparatus 200.

Although specific embodiments of the invention have been described and illustrated, the invention is not to be limited to the specific forms or arrangements of parts so described and illustrated. As an example, the fabrication methods in accordance with the invention may use a metal or a metal alloy (collectively referred to herein as "metal") other than Cu to form the damascene structures. The scope of the invention is to be defined by the claims appended hereto and their equivalents.

What is claimed is:

1. A method for fabricating a metal damascene structure in a semiconductor wafer, said method comprising:
provided said semiconductor wafer that includes a dielectric layer with trenches below an upper surface, a barrier layer over said dielectric layer and a metal layer over said barrier layer;
removing an upper portion of said metal layer using a first polishing technique such that an intermediate portion and a lower portion of said metal layer remain over said barrier layer;
removing said intermediate portion of said metal layer using a second polishing technique such that said lower portion of said metal layer remains over said barrier layer;
removing said lower portion of said metal layer using a third polishing technique until said barrier layer on said upper surface of said dielectric layer is exposed; and
removing said barrier layer on said upper surface of said dielectric using a fourth polishing technique until said upper surface of said dielectric layer is exposed to produce said metal damascene structure.

2. The method of claim 1 wherein at least one of said removing of said upper portion of said metal layer and said removing of said intermediate portion of said metal layer includes performing a chemical-mechanical polishing using a slurry, and wherein said removing said lower portion of said metal layer includes performing another chemical-mechanical polishing using another slurry, said another chemical-mechanical polishing having a lower removal rate than said chemical-mechanical polishing.

3. The method of claim 1 wherein said upper portion of said metal layer and said intermediate portion of said metal layer have substantially the same thickness.

4. The method of claim 1 wherein said lower portion of said metal layer is thinner than said upper portion and said intermediate portion of said metal layer.

5. The method of claim 1 wherein at least one of said removing of said upper portion of said metal layer and said removing of said intermediate portion of said metal layer includes performing one of electro-chemical-mechanical polishing and electro-chemical polishing.

6. A method for fabricating a metal damascene structure in a semiconductor wafer, said method comprising:
provided said semiconductor wafer that includes a dielectric layer with trenches below an upper surface, a barrier layer over said dielectric layer and a metal layer over said barrier layer;
removing an upper portion of said metal layer using a first polishing technique such that an intermediate portion and a lower portion of said metal layer remain over said barrier layer, including polishing said upper portion of said metal layer at a first polishing unit of a polishing apparatus;
removing said intermediate portion of said metal layer using a second polishing technique such that said lower portion of said metal layer remains over said barrier layer, including polishing said intermediate portion of said metal layer at a second polishing unit of said polishing apparatus;
removing said lower portion of said metal layer using a third polishing technique until said barrier layer on said upper surface of said dielectric layer is exposed, including polishing said lower portion of said metal Layer at a third polishing unit of said polishing apparatus; and
removing said barrier layer on said upper surface of said dielectric using a fourth polishing technique until said upper surface of said dielectric layer is exposed to produce said metal damascene structure, including polishing said barrier layer on said upper surface of said dielectric layer at a fourth polishing unit of said polishing apparatus.

7. The method of claim 6 wherein said removing of said upper portion of said metal layer includes polishing said upper portion of said metal layer using a first polishing head at said first polishing unit of a polishing apparatus, wherein said removing of said intermediate portion of said metal layer includes polishing said intermediate portion of said metal layer using a second polishing head at said second polishing unit of said polishing apparatus, wherein said removing of said lower portion of said metal layer includes polishing said lower portion of said metal layer using a third polishing head at said third polishing unit of said polishing apparatus and wherein said removing of said barrier layer includes polishing said barrier layer on said upper surface of said dielectric layer using a fourth polishing head at said fourth polishing unit of said polishing apparatus.

8. The method of claim 6 further comprising transferring said semiconductor wafer between said first, second, third and fourth polishing units of said polishing apparatus using at least one pivotable load/unload cup.

9. The method of claim 8 wherein said transferring of said semiconductor wafer between said first, second, third and fourth polishing units includes:
transferring said semiconductor wafer from said first polishing unit to said second polishing unit using a first pivotable load/unload cup;
transferring said semiconductor wafer from said second polishing unit to said third polishing unit using a second pivotable load/unload cup; and
transferring said semiconductor wafer from said third polishing unit to said fourth polishing unit using a third pivotable load/unload cup.

* * * * *